(12) United States Patent
Hwang

(10) Patent No.: US 10,240,253 B2
(45) Date of Patent: Mar. 26, 2019

(54) APPARATUS FOR MANUFACTURING LARGE SCALE SINGLE CRYSTAL MONOLAYER OF HEXAGONAL BORON NITRIDE AND METHOD FOR MANUFACTURING THE SAME

(71) Applicant: KOREA RESEARCH INSTITUTE OF STANDARDS AND SCIENCE, Daejeon (KR)

(72) Inventor: ChanYong Hwang, Seoul (KR)

(73) Assignee: Korea Reseach Institute of Standards and Science, Daejeon (KR)

(*) Notice: Subject to any disclaimer, the term of this patent is extended or adjusted under 35 U.S.C. 154(b) by 204 days.

(21) Appl. No.: 15/298,367

(22) Filed: Oct. 20, 2016

(65) Prior Publication Data
US 2017/0268123 A1 Sep. 21, 2017

(30) Foreign Application Priority Data

Mar. 17, 2016 (KR) .................... 10-2016-0032312

(51) Int. Cl.
C30B 25/18 (2006.01)
H01L 29/20 (2006.01)
(Continued)

(52) U.S. Cl.
CPC ............ C30B 25/186 (2013.01); C30B 23/02 (2013.01); C30B 25/08 (2013.01); C30B 25/14 (2013.01);
(Continued)

(58) Field of Classification Search
CPC ..... H01L 29/2003; C30B 23/02; C30B 25/18; C30B 29/38
See application file for complete search history.

(56) References Cited

U.S. PATENT DOCUMENTS

2012/0015166 A1* 1/2012 Kelber .................. B82Y 30/00
428/215
2015/0131371 A1* 5/2015 Suh ....................... G11C 11/161
365/158

(Continued)

FOREIGN PATENT DOCUMENTS

KR 10-2014-0115868 A 10/2014

OTHER PUBLICATIONS

Wood et al, van der Waals epitaxy of monolayer hexagonal boron nitride on copper foil; growth, crystallography and electronic band structure, IOP Publishing, 2D Mater. 2 (2015) p. 1-9 (Year: 2015).*

Primary Examiner — Matthew J Song
(74) Attorney, Agent, or Firm — Rabin & Berdo, P.C.

(57) ABSTRACT

A method for manufacturing a large-scale single crystal monolayer of hBN including: preparing a single crystal copper substrate of (111) face in a chemical vapor deposition (CVD) apparatus; removing impurities of the single crystal copper substrate of (111) face; forming a plurality of hBN crystal seeds by depositing a vaporized ammonia borane or a vaporized borazine on the surface of the single crystal copper substrate from which the impurities are removed; and forming a large-scale single crystal monolayer of hBN grown by mutual coherence between the hBN crystal seeds, an apparatus for manufacturing the same, and a substrate for a monolayer UV graphene growth using the same.

6 Claims, 3 Drawing Sheets

(51) Int. Cl.
  *C30B 25/08* (2006.01)
  *C30B 25/14* (2006.01)
  *C30B 25/16* (2006.01)
  *C30B 29/38* (2006.01)
  *C30B 23/02* (2006.01)
  *C30B 29/40* (2006.01)

(52) U.S. Cl.
  CPC ............ *C30B 25/165* (2013.01); *C30B 25/18* (2013.01); *C30B 29/38* (2013.01); *C30B 29/403* (2013.01); *H01L 29/2003* (2013.01)

(56) References Cited

U.S. PATENT DOCUMENTS

| | | | |
|---|---|---|---|
| 2015/0225844 A1* | 8/2015 | Van Baarle | B82Y 30/00 427/249.1 |
| 2015/0232336 A1* | 8/2015 | Matter | C01B 21/064 427/212 |
| 2016/0307756 A1* | 10/2016 | Fujii | H01L 21/0485 |

* cited by examiner

APPARATUS FOR MANUFACTURING LARGE SCALE SINGLE CRYSTAL MONOLAYER OF HEXAGONAL BORON NITRIDE AND METHOD FOR MANUFACTURING THE SAME

BACKGROUND OF THE INVENTION

1. Field of the Invention

The present invention relates to an apparatus for manufacturing a large-scale single crystal monolayer of hexagonal boron nitride (hBN) and a method for manufacturing the same, and more particularly, to a technique for manufacturing a large-scale single crystal monolayer of hBN using a single-crystal copper substrate of (111) face.

2. Description of the Related Art

It is known that two-dimensional nano graphene has a similar property to a metal and two-dimensional nano-molybdenum disulfide or molybdenum selenide has a similar property to a semiconductor.

Further, hexagonal boron nitride (hBN) has a similar property to an insulator and a band gap of about 6 eV.

Methods for manufacturing two-dimensional materials have been developed by various methods such as synthesis, but there are problems in that characteristics are deteriorated due to polycrystal growth and large-scale growth is difficult.

The hBN is manufactured on the surface of a copper thin film or a platinum thin film by applying a mechanical peeling method, a chemical peeling method, or a chemical vapor deposition method. However, in the hBN manufactured by the mechanical peeling method or the chemical peeling method, a large-scale growth is difficult, and when the hBN manufactured by the chemical vapor deposition method is grown in a large scale, an electric or mechanical characteristic of the hBN is deteriorated due to polycrystal growth.

In Korean Patent Application Publication No. 2014-0115868, a method of growing a single layer of hBN using a low-pressure chemical vapor deposition method is disclosed, but there is a problem in that by using a polycrystalline surface substrate, precision control for growth of a sub-monolayer single layer of hBN is difficult and thus an electric characteristic is deteriorated.

SUMMARY OF THE INVENTION

According to an aspect of the present invention, a method for manufacturing a large-scale single crystal monolayer of hexagonal Boron Nitride (hBN) includes: preparing a single crystal copper substrate of (111) face in a chemical vapor deposition (CVD) apparatus; removing impurities of the single crystal copper substrate of (111) face; forming a plurality of hBN crystal seeds by depositing a vaporized ammonia borane or a vaporized borazine on the surface of the single crystal copper substrate from which the impurities are removed; and forming a large-scale single crystal monolayer of hBN grown by mutual coherence between the hBN crystal seeds.

According to another aspect of the present invention, the present invention includes a large-scale single crystal monolayer of hBN manufactured by the method for manufacturing the large-scale single crystal monolayer of hBN, a substrate for a monolayer graphene growth using the large-scale single crystal monolayer of hBN, and a monolayer UV emission element using the large-scale single crystal monolayer of hBN.

According to yet another aspect of the present invention, an apparatus for manufacturing a large-scale single crystal monolayer of hBN includes: a CVD apparatus that removes the impurities of the single crystal copper substrate and deposits the vaporized ammonia borane or the vaporized borazine supplied from the high molecular weight sublimation apparatus on the surface of the single crystal copper substrate from which the impurities are removed to form the plurality of hBN crystal seeds and grows the single crystal copper substrate by mutual coherence between the hBN crystal seeds to form the large-scale single crystal monolayer of hBN; and a high molecular weight sublimation apparatus which sublimates ammonia borane powder to the vaporized ammonia borane or vaporizes the ammonia borane powder to the vaporized borazine to be supplied to the CVD apparatus.

DETAILED DESCRIPTION OF THE PREFERRED EMBODIMENTS

Figure 1:
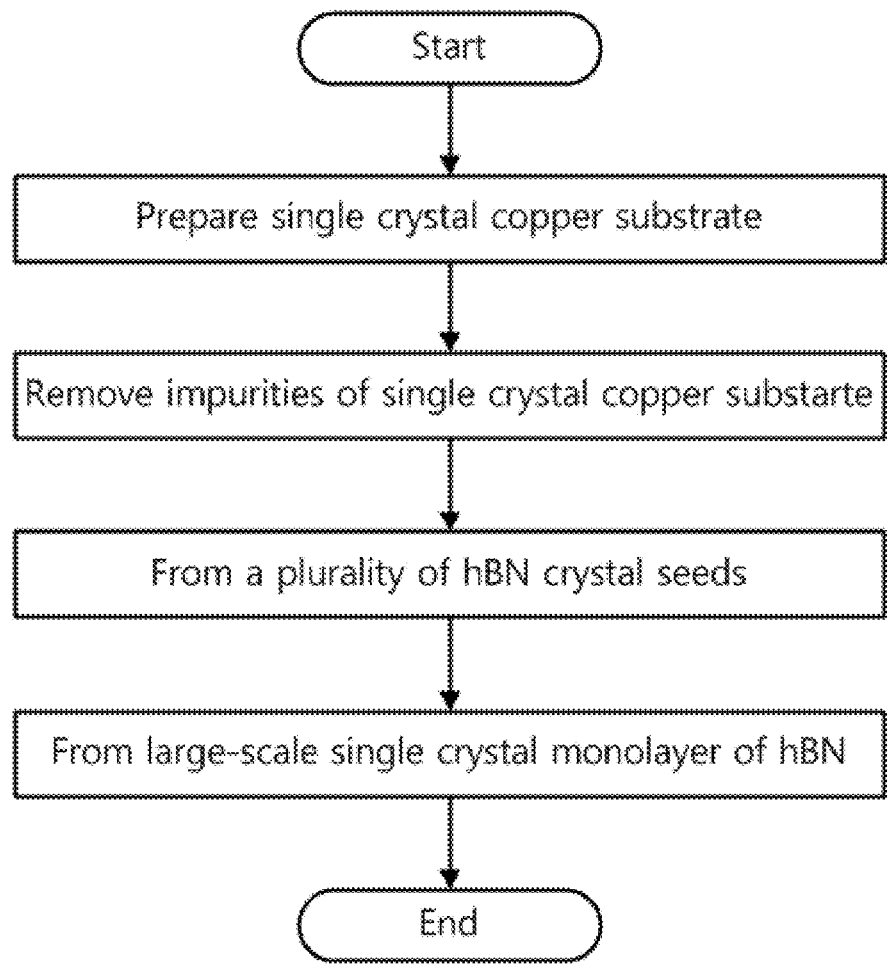
FIG. 1 is a flow chart of a method for manufacturing a large-scale single crystal monolayer of hBN of the present invention.

The following detailed description of the present invention provides specific embodiments for achieving the present invention and refers to the accompanying drawings. The embodiments will be described in detail to be enough for those skilled in the art to achieve the present invention. It should be understood that the embodiments of the present invention are different, but not necessarily exclusive to each other. For example, specific shapes, structures, and characteristics described herein may be implemented by other embodiments without departing from the scope and spirit of the present invention in association with an embodiment. Further, it should be understood that the positions and arrangements of the components in the embodiments described herein may be changed without departing from the scope and the spirit of the present invention. Accordingly, the following detailed description is not limitative, but is limited only the claims, including those equivalents to the claims, as long as the scope of the present invention is appropriately described. Like reference numerals indicate the same or similar functions in various respects in the drawings.

FIG. 1 is a flow chart of a method for manufacturing a large-scale single crystal monolayer of hBN of the present invention. The method for manufacturing the large-scale single crystal monolayer of hBN includes preparing a single crystal copper substrates of (111) face in a chemical vapor deposition (CVD) apparatus.

The CVD apparatus may include a quartz pipe which is a main chamber for providing a growth space by positioning a single crystal copper substrate, a vacuum pump for creating vacuum in the quartz pipe, an electric furnace in which heat wires are embedded around the quartz pipe, and a gas supply pipe.

The vacuum pump may maintain the degree of vacuum of about 1 mTorr to 10 mTorr and maintain the degree of vacuum of 5 mTorr to 50 mTorr during single crystal growth, and the degree of vacuum may be adjusted by variables such as a volume, a temperature, and the like.

The electric furnace may further include a temperature control device, an available temperature range of the electric furnace is from room temperature to 1,100° C., and the heat wires of the electric furnace consist of tungsten, kanthal, or wires to be heated.

In the single crystal copper substrate, the surface of the copper thin film is formed with (111) face.

The method for manufacturing the large-scale single crystal monolayer of hBN includes a step of depositing the copper thin film on a metal, semiconductor, oxide or nitride substrate with a thickness of 10 nm or more and growing the surface of the copper thin film to the (111) face by heating the copper thin film deposited on the substrate, in the preparing of the single crystal copper substrate of the (111) face. Further, the (111) face of the copper single crystal may be used as a substrate for hBN growth.

In the preparing of the single crystal copper substrate of the (111) face, the single crystal copper substrate of the (111) face may be prepared by annealing the copper thin film to be aligned to the (111) face on the metal, semiconductor, oxide or nitride substrate and the single crystal copper itself of the (111) face may be prepared as the substrate.

The method for manufacturing the large-scale single crystal monolayer of hBN includes a step of removing impurities of the single crystal copper substrate. In the removing of the impurities of the single crystal copper substrate, the impurities of the single crystal copper substrate are removed by heating the single crystal copper substrate at 800° C. to 1,000° C. for 30 to 50 minutes under a hydrogen atmosphere to more promote the growth of the large-scale single crystal monolayer of hBN.

An vaporized ammonia borane or a vaporized borazine is deposited on the surface of the single crystal copper substrate in which the impurities are removed to form a plurality of hBN crystal seeds.

The vaporized ammonia borane is generated by sublimating ammonia borane powder at a temperature of 80° C. to 140° C. by using a high molecular weight sublimation apparatus and transported to a CVD apparatus by inert gas or source gas to be deposited on the surface of the single crystal copper substrate.

The vaporized ammonia borane may be a vaporized material which is decomposed to a borazine by-product such as borazine, cycloborazine, or polyamino borazine and hydrogen.

The vaporized borazine may be generated by vaporizing a borazine liquid by using the high molecular weight sublimation apparatus and the vaporized borazine gas is transported to the CVD apparatus to be deposited on the surface of the single crystal copper substrate.

The present invention is characterized by depositing a borazine component obtained from the vaporized ammonia borane or a component vaporized from the borazine liquid on the surface of the heated single crystal copper substrate.

Figure 2:
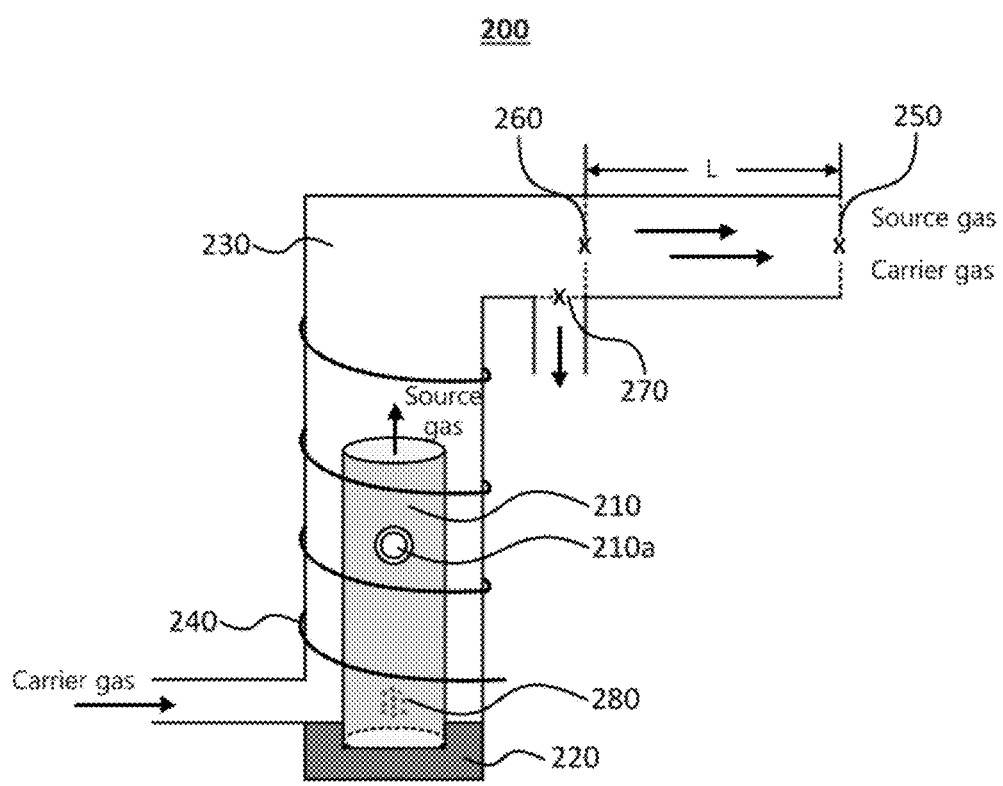
FIG. 2 is a schematic diagram of a high molecular weight sublimation apparatus.

FIG. 2 is a schematic diagram of a high molecular weight sublimation apparatus. A high molecular weight sublimation apparatus 200 sublimates ammonia borane powder 280 to the vaporized ammonia borane and supplies the vaporized ammonia borane to a CVD apparatus by injecting inert gas or carrier gas.

The high molecular weight sublimation apparatus 200 includes a crucible 210, a holder 220, a gas pipe 230, and a heat wire 240.

The crucible 210 has a pipe shape, and a central hole 210a which is an injection passage of the ammonia borane powder 280 is formed on one surface, a discharge hole which is a discharge passage of the vaporized ammonia borane is formed on one end, and the other end is sealed. The crucible 210 may be formed by one of a quartz pipe, a pyrex pipe and a sapphire pipe.

The crucible 210 may have a diameter of 20 mm to 50 mm and a length of 80 mm to 120 mm, and the central hole 210a may have a diameter of 10 mm to 15 mm.

The holder 220 contacts the other end of the crucible 210 to seal and fix the other end of the crucible 210.

The gas pipe 230 includes an inlet, an outlet, and a housing pipe, and the inlet is an injection passage of inert gas, the outlet is a supply passage for supplying the vaporized ammonia borane and the inert gas to the CVD apparatus, and the housing pipe houses the crucible 210 and the holder 220.

The inert gas or the source gas may be hydrogen, nitrogen or argon gas, and preferably hydrogen. In the case of hydrogen, the carrier gas of an amount of about 1 ppm to 50 ppm is supplied to grow the surface of the single crystal monolayer of hBN in a large scale.

The high molecular weight sublimation apparatus 200 may further include a first valve 250 and a second valve 260 which measure and control an amount of vaporized ammonia borane and an amount of inert gas which are supplied to the CVD apparatus, and further include a third valve 270 discharging the vaporized ammonia borane and the inert gas.

The high molecular weight sublimation apparatus 200 vaporizes the borazine liquid to supply the vaporized borazine to the CVD apparatus.

The method for manufacturing the large-scale single crystal monolayer of hBN is characterized by forming a plurality of hBN crystal seeds by heating the single crystal copper substrate in which the impurities are removed at a temperature of 950° C. to 1,050° C. and depositing the vaporized ammonia borane or the vaporized borazine on the surface of the single crystal copper substrate. The single crystal copper substrate from which the impurities are removed may be melted at a temperature of 1,050° C. or more.

When the borazine by-product included in the vaporized ammonia borane is deposited on the heated single crystal substrate, the borazine by-product is decomposed to boron and nitrogen and form the plurality of hBN crystal seeds by self-bonding or mutual coherence.

The method for manufacturing the large-scale single crystal monolayer of hBN is characterized by forming the plurality of hBN crystal seeds to correspond to a crystal direction of the surface of the single crystal copper substrate, in the forming of the plurality of hBN crystal seeds.

In the method for manufacturing the large-scale single crystal monolayer of hBN, the single crystal monolayer of hBN is grown by mutual coherence between the hBN crystal seeds.

The method for manufacturing the large-scale single crystal monolayer of hBN is characterized by growing the surface of the single crystal monolayer of hBN in the large scale by adjusting the amount of vaporized ammonia borane and the amount of inert gas and growing the surface of the single crystal monolayer of hBN in the large scale by measuring and adjusting the amount of vaporized borazine, in the forming of the large-scale single crystal monolayer of hBN.

The high molecular weight sublimation apparatus may include a first valve and a second valve which measure and adjust the amount of vaporized ammonia borane and the amount of inert gas which are supplied to the CVD apparatus and include a third valve which discharges the vaporized ammonia borane or the inert gas.

The high molecular weight sublimation apparatus cleans the inside of the gas pipe by bypassing the vaporized ammonia borane through the third valve and then calculates an area of the plurality of hBN crystal seeds to deduce the deposition conditions by a graph form of the hBN versus the sublimation temperature and may control the amount of gas contained in a length L between the first valve and the second valve based on the deposition conditions and control the amount to be a sub monolayer (0.1 to 0.9 monolayer) of the hBN crystal seed during one-time growth.

In the high molecular weight sublimation apparatus, when the surface of the single crystal monolayer of hBN is grown with the amount of gas contained in the L, the growth amount of hBN crystal seed may be 0.5 ML to 0.7 ML and preferably 0.6 ML.

In the method for manufacturing the large-scale single crystal monolayer of hBN, when the distance between the plurality of hBN crystal seeds during initial growth is far away from a reference or more, a defect may be generated in the single crystal of the large-scale single crystal monolayer of hBN, and when the distance is close to less than the reference, the size of the single crystal of the large-scale single crystal monolayer of hBN is decreased and the defect during mutual coherence growth may be generated.

In the forming of the large-scale single crystal monolayer of hBN, the single crystal monolayer of hBN may be cooled by interrupting the vaporized ammonia borane and adjusting the inert gas or grown in the large scale.

Further, in the forming of the large-scale single crystal monolayer of hBN, the amount of inert gas may be adjusted or a flow of the inert gas may be decreased by considering the size of the quartz pipe, a capacity of the vacuum pump, and the like of the CVD apparatus.

The high molecular weight sublimation apparatus may measure and adjust the amount of vaporized borazine and control the discharge through the aforementioned valves.

The large-scale single crystal monolayer of hBN may be completed by using a copper etchant. The copper etchant may include a ferric chloride ($FeCl_3$) or ammonium persulfate solution and the like, and in the process of completing the large-scale single crystal monolayer of hBN, various kinds of copper etchants may be selected and used according to etching velocity and environments of copper.

The CVD apparatus removes the impurities of the single crystal copper substrate and deposits the vaporized ammonia borane or the vaporized borazine supplied from the high molecular weight sublimation apparatus on the surface of the single crystal copper substrate from which the impurities are removed to form the plurality of hBN crystal seeds. The single crystal copper substrate is grown by mutual coherence between the hBN crystal seeds to form the large-scale single crystal monolayer of hBN.

Figure 3:
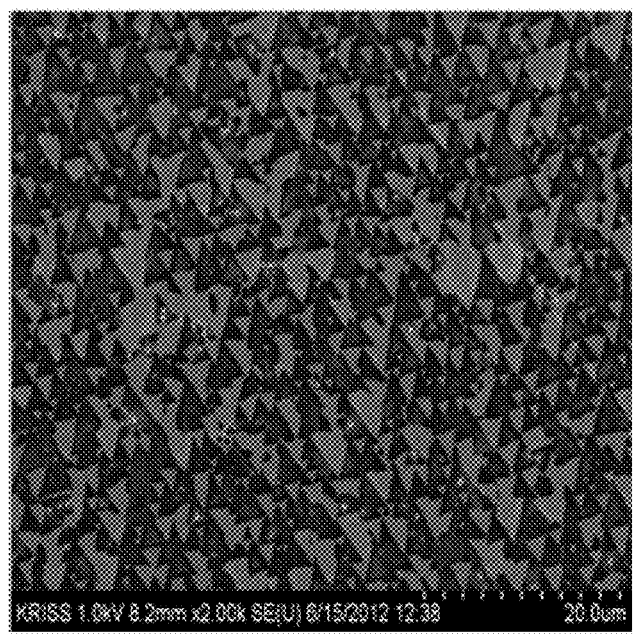
FIG. 3 is a photograph of a large-scale single crystal monolayer of hBN grown on the surface of a single crystal copper substrate.

FIG. 3 is a photograph of a large-scale single crystal monolayer of hBN grown on the surface of a single crystal copper substrate. The CVD apparatus controls the growth time, the amount of vaporized ammonia borane, and the amount of inert gas or control the amount of vaporized borazine to be grown in the entire surface of the large-scale single crystal monolayer of hBN.

In the method of manufacturing the large-scale single crystal monolayer of hBN, the monolayer of hBN is grown to the large-scale single crystal to manufacture an emission element in a UV range as a substrate for a monolayer or graphene growth and the sub monolayer is controlled by using the high molecular weight sublimation apparatus to remove or reduce defect elements generated in the monolayer growth.

Hereinabove, although the present invention is described by specific matters such as concrete components, and the like, embodiments, and drawings, they are provided only for assisting in the entire understanding of the present invention. Therefore, the present invention is not limited to the embodiments. Various modifications and changes may be made by those skilled in the art to which the present invention pertains from this description.

Therefore, the sprit of the present invention should not be limited to the above-described embodiments, and the following claims as well as all modified equally or equivalently to the claims are intended to fall within the scope and spirit of the invention.

What is claimed is:

1. A method for manufacturing a large-scale single crystal monolayer of hexagonal boron nitride (hBN), comprising:
    preparing a single crystal copper substrate in a chemical vapor deposition (CVD) apparatus, wherein the single crystal copper substrate is formed with a (111) surface;
    removing impurities from the surface of the single crystal copper substrate;
    forming a plurality of hBN crystal seeds by depositing a vaporized ammonia borane or a vaporized borazine on the surface of the single crystal copper substrate such that a crystal direction of the plurality of hBN crystal seeds corresponds to a crystal direction of the surface of the single crystal copper substrate; and
    forming the large-scale single crystal monolayer of hBN by mutual coherence between the hBN crystal seeds grown epitaxially,
    wherein distances between the plurality of hBN crystal seeds are adjusted by controlling at least one of an amount of the vaporized ammonia borane, an amount of inert gas and an exposure time, thereby reducing a defect that may be generated in a single crystal of the large-scale single crystal monolayer of hBN and in the mutual coherence between the hBN crystal seeds.

2. The method of claim 1, wherein the preparing of the single crystal copper substrate includes:
    depositing a copper thin film with a thickness of 10 nm or more on a metal, semiconductor, oxide or nitride substrate; and
    growing a surface of the copper thin film to have the (111) face by heating the copper thin film deposited on the substrate.

3. The method of claim 1, wherein said removing impurities is performed by heating the single crystal copper substrate at 800° C. to 1,000° C. for 30 to 50 minutes under a hydrogen atmosphere.

4. The method of claim 1, wherein the plurality of hBN crystal seeds is formed by heating the single crystal copper substrate at a temperature of 950° C. to 1,050° C. and depositing the vaporized ammonia borane or the vaporized borazine on the surface of the single crystal copper substrate.

5. The method of claim 1, wherein in the forming of the plurality of hBN crystal seeds, a borazine component obtained from the vaporized ammonia borane or a component vaporized from the borazine liquid is deposited on the surface of the heated single crystal copper substrate.

6. The method of claim 1, wherein the vaporized ammonia borane is generated by sublimating ammonia borane powder at a temperature of 80° C. to 140° C. by using a high molecular weight sublimation apparatus and transported to the CVD apparatus by inert gas to be deposited on the surface of the single crystal copper substrate.

* * * * *